(12) United States Patent
Rogers et al.

(10) Patent No.: US 10,146,189 B2
(45) Date of Patent: Dec. 4, 2018

(54) SAFETY CHAIN CIRCUIT

(75) Inventors: Kyle W. Rogers, Stamford, CT (US); Daryl J. Marvin, Farmington, CT (US)

(73) Assignee: Otis Elevator Company, Farmington, CT (US)

( * ) Notice: Subject to any disclaimer, the term of this patent is extended or adjusted under 35 U.S.C. 154(b) by 886 days.

(21) Appl. No.: 14/411,247

(22) PCT Filed: Jun. 26, 2012

(86) PCT No.: PCT/US2012/044209
§ 371 (c)(1),
(2), (4) Date: Dec. 24, 2014

(87) PCT Pub. No.: WO2014/003722
PCT Pub. Date: Jan. 3, 2014

(65) Prior Publication Data
US 2015/0192906 A1    Jul. 9, 2015

(51) Int. Cl.
*B66B 1/28* (2006.01)
*B66B 1/30* (2006.01)
*B66B 1/14* (2006.01)
*G05B 9/03* (2006.01)
*B66B 13/22* (2006.01)
*H03F 3/08* (2006.01)

(52) U.S. Cl.
CPC ............. *G05B 9/03* (2013.01); *B66B 1/28* (2013.01); *B66B 13/22* (2013.01); *H03F 3/08* (2013.01)

(58) Field of Classification Search
CPC .......... G05B 9/03; G05B 9/003; B66B 25/00; B66B 1/28; B66B 13/22; B66B 1/30; B66B 1/285; B66B 1/308; G07F 11/00; G07F 11/165; G06B 29/005; G06B 29/00
See application file for complete search history.

(56) References Cited

U.S. PATENT DOCUMENTS 5,601,178 A    2/1997    Zaharia et al.
5,808,514 A    9/1998    Kolluri
(Continued)

FOREIGN PATENT DOCUMENTS

| DE | 1288774 | 2/1969 |
| WO | 2006108433 | 10/2006 |
| WO | 2010067455 | 6/2010 |

OTHER PUBLICATIONS

EP search report for EP12879962.4 dated Jan. 7, 2016.

*Primary Examiner* — Thuy Dao
(74) *Attorney, Agent, or Firm* — O'Shea Getz P.C.

(57) ABSTRACT

A safety chain circuit includes a plurality of protection devices connected between a first chain end and a second chain end, and an amplifier. The amplifier includes a first device switch and a second device switch connected between an input and an output, a first enabling switch connected between the second chain end and a second enabling switch, and a first control switch and a second control switch. The first enabling switch selectively enables the first control switch to control the first device switch. The second enabling switch selectively enables the second control switch to control the second device switch. The first control switch, when enabled, selectively controls the first device switch in response to receiving a first control signal. The second control switch, when enabled, selectively controls the second device switch in response to receiving a second control signal.

20 Claims, 4 Drawing Sheets

(56) References Cited

U.S. PATENT DOCUMENTS

| | | | |
|---|---|---|---|
| 6,056,088 A | | 5/2000 | Gerstenkorn |
| 6,173,814 B1 | | 1/2001 | Herkel et al. |
| 6,446,760 B1 | | 9/2002 | Lisi |
| 6,467,585 B1 | | 10/2002 | Gozzo et al. |
| 7,896,135 B2 | * | 3/2011 | Kattainen ................ B66B 1/30 187/248 |
| 7,905,330 B2 | * | 3/2011 | Jahkonen .............. B66B 5/0018 187/247 |
| 8,897,898 B2 | * | 11/2014 | Nakagawa .............. B64C 13/42 700/21 |
| 9,902,592 B2 | * | 2/2018 | Sonnenmoser ......... B66B 13/22 |
| 2008/0278984 A1 | | 11/2008 | Stanley |
| 2010/0051391 A1 | * | 3/2010 | Jahkonen .............. B66B 5/0018 187/393 |
| 2010/0096931 A1 | * | 4/2010 | Jahkonen ................ B66B 1/30 307/80 |
| 2010/0116595 A1 | * | 5/2010 | Kang ....................... B66B 1/30 187/289 |
| 2011/0094837 A1 | * | 4/2011 | Gewinner ......... H02M 3/33523 188/171 |
| 2013/0300339 A1 | * | 11/2013 | Boom .................... H02P 23/02 318/812 |
| 2014/0190773 A1 | * | 7/2014 | Sonnenmoser ......... B66B 13/22 187/247 |

\* cited by examiner

SAFETY CHAIN CIRCUIT

This application is entitled to the benefit of, and incorporates by reference essential subject matter disclosed in PCT Application No. PCT/US2012/044209 filed on Jun. 26, 2012.

BACKGROUND OF THE INVENTION

1. Technical Field

The present invention relates to methods and apparatus for ensuring safe operation of a system in general, and methods and apparatus that utilize a safety chain circuit to ensure safe operation of, for example, an elevator system in particular.

2. Background Information

Typical elevator systems include a plurality of protection devices (e.g., door lock contacts, emergency switches, overspeed devices, etc.) connected in series. This series of protection devices is commonly referred to as a safety chain because if any of the devices (i.e. links in the chain) fail—the chain is broken and the elevator system stops operating in its normal mode. The safety chain is typically supplied with voltage from either an AC or DC source, and in some instances also includes one or more safety relays attached to the end of the safety chain. Typical safety chains are required to run the entire length of an elevator hoistway, and in many instances they run the length of the hoistway several times. As a result, the length of the transmission path of the safety chain can become prohibitively long, necessitating a power supply that is sufficiently sized to accommodate multiple, and sometimes large, relay configurations.

When contacts of each of the protection devices and relays within the safety chain are closed, the safety chain permits the normal operation of the elevator. When the contact of one or more of the protection devices or relays within the safety chain is open, an elevator brake is actuated (e.g., dropped) and power is disconnected from an elevator drive motor in order to prevent normal operation of the elevator system.

SUMMARY OF THE INVENTION

According to an aspect of the invention, a safety chain circuit is provided for use with a control system that provides a first control signal and a second control signal. The safety chain circuit includes a plurality of protection devices serially connected between a first chain end and a second chain end, and an amplifier. The amplifier includes a first device switch and a second device switch serially connected between a power input and a power output, a first enabling switch connected between the second chain end and a second enabling switch, and a first control switch and a second control switch. The first enabling switch is operable to enable the first control switch to control the first device switch. The second enabling switch is operable to enable the second control switch to control the second device switch. The first control switch, when enabled, is operable to control the first device switch in response to receiving the first control signal. The second control switch, when enabled, is operable to control the second device switch in response to receiving the second control signal.

Alternatively or in addition to this or other aspects of the invention, the first control switch is connected between the first enabling switch and the first device switch, and the second control switch is connected between the second enabling switch and the second device switch.

Alternatively or in addition to this or other aspects of the invention, the first chain end is connected to a first power source, and the power input is connected to a second power source that is different than the first power source.

Alternatively or in addition to this or other aspects of the invention, the second chain end is electrically isolated from the power output.

Alternatively or in addition to this or other aspects of the invention, the first enabling switch and the second enabling switch are operable to respectively enable the first control switch and the second control switch in a safe mode, and respectively disable the first control switch and the second control switch in an unsafe mode.

Alternatively or in addition to this or other aspects of the invention, the amplifier also includes a safety chain monitor operable to monitor status of the plurality of protection devices. The second enabling switch is connected between the first enabling switch and the safety chain monitor.

Alternatively or in addition to this or other aspects of the invention, the amplifier also includes a first monitor switch connected to the first device switch. The first monitor switch is operable to monitor status of the first device switch.

Alternatively or in addition to this or other aspects of the invention, the amplifier also includes a second monitor switch connected to the second device switch. The second monitor switch is operable to monitor status of the second device switch.

Alternatively or in addition to this or other aspects of the invention, the amplifier also includes a safety chain monitor operable to monitor status of the plurality of protection devices, a first monitor switch operable to monitor status of the first device switch, and a second monitor switch operable to monitor status of the second device switch. The safety chain monitor, the first monitor switch and the second monitor switch are also operable to provide respective feedback signals to the control system indicative of the status of the plurality of protection devices, the first device switch and the second device switch. The second enabling switch is connected between the first enabling switch and the safety chain monitor. The first monitor switch is connected to the first device switch. The second monitor switch is connected to the second device switch.

Alternatively or in addition to this or other aspects of the invention, the first enabling switch is operable to connect the first device switch to an electrical ground through the first control switch.

Alternatively or in addition to this or other aspects of the invention, the second enabling switch is operable to connect the second control switch to the electrical ground such that the second control switch is operable to receive the second control signal.

Alternatively or in addition to this or other aspects of the invention, the plurality of protection devices include a plurality of elevator protection devices.

Alternatively or in addition to this or other aspects of the invention, one of the plurality of elevator protection devices is configured as one of an elevator door lock contact, an elevator emergency switch or an elevator overspeed device.

Alternatively or in addition to this or other aspects of the invention, the plurality of protection devices include a plurality of elevator protection devices or a plurality of industrial automation system protection devices.

Alternatively or in addition to this or other aspects of the invention, the first control switch is a solid state first control switch (e.g., a MOSFET), and/or the second control switch is a solid state second control switch (e.g., a MOSFET).

According to another aspect of the invention, an elevator system is provided that includes one or more elevator drive components respectively connected to one or more disconnect switches, an elevator drive control system, a plurality of elevator protection devices serially connected between a first power source and a chain end, and an amplifier. The elevator drive control system is operable to control the one or more elevator drive components, and provide a first control signal and a second control signal. The amplifier includes a first device switch and a second device switch serially connected between a second power source and the one or more disconnect switches, a first enabling switch connected between the chain end and a second enabling switch, and a solid state first control switch and a solid state second control switch. The first enabling switch is operable to enable the first control switch to control the first device switch. The second enabling switch is operable to enable the second control switch to control the second device switch. The first control switch, when enabled, is operable to control the first device switch in response to receiving the first control signal. The second control switch, when enabled, is operable to control the second device switch in response to receiving the second control signal.

Alternatively or in addition to this or other aspects of the invention, the first enabling switch and the second enabling switch are operable to respectively enable the first control switch and the second control switch in a safe mode, and respectively disable the first control switch and the second control switch in an unsafe mode. The second power source is operable to provide electrical power to the one or more disconnect switches through the first device switch and the second device switch in the safe mode, but not in the unsafe mode.

Alternatively or in addition to this or other aspects of the invention, the first enabling switch is operable to connect the first device switch to an electrical ground through the first control switch. The second enabling switch is operable to connect the second control switch to the electrical ground such that the second control switch is operable to receive the second control signal.

Alternatively or in addition to this or other aspects of the invention, the one or more elevator drive components include at least one of an elevator drive and an elevator machine brake.

According to another aspect of the invention, an escalator system is provided that includes one or more escalator drive components respectively connected to one or more disconnect switches, an escalator drive control system, a plurality of escalator protection devices serially connected between a first power source and a chain end, and an amplifier. The escalator drive control system is operable to control the one or more escalator drive components, and provide a first control signal and a second control signal. The amplifier includes a first device switch and a second device switch serially connected between a second power source and the one or more disconnect switches, a first enabling switch connected between the chain end and a second enabling switch, and a solid state first control switch and a solid state second control switch. The first enabling switch is operable to enable the first control switch to control the first device switch. The second enabling switch is operable to enable the second control switch to control the second device switch. The first control switch, when enabled, is operable to control the first device switch in response to receiving the first control signal. The second control switch, when enabled, is operable to control the second device switch in response to receiving the second control signal.

The foregoing features and the operation of the invention will become more apparent in light of the following description and the accompanying drawings.

DETAILED DESCRIPTION

Figure 1:
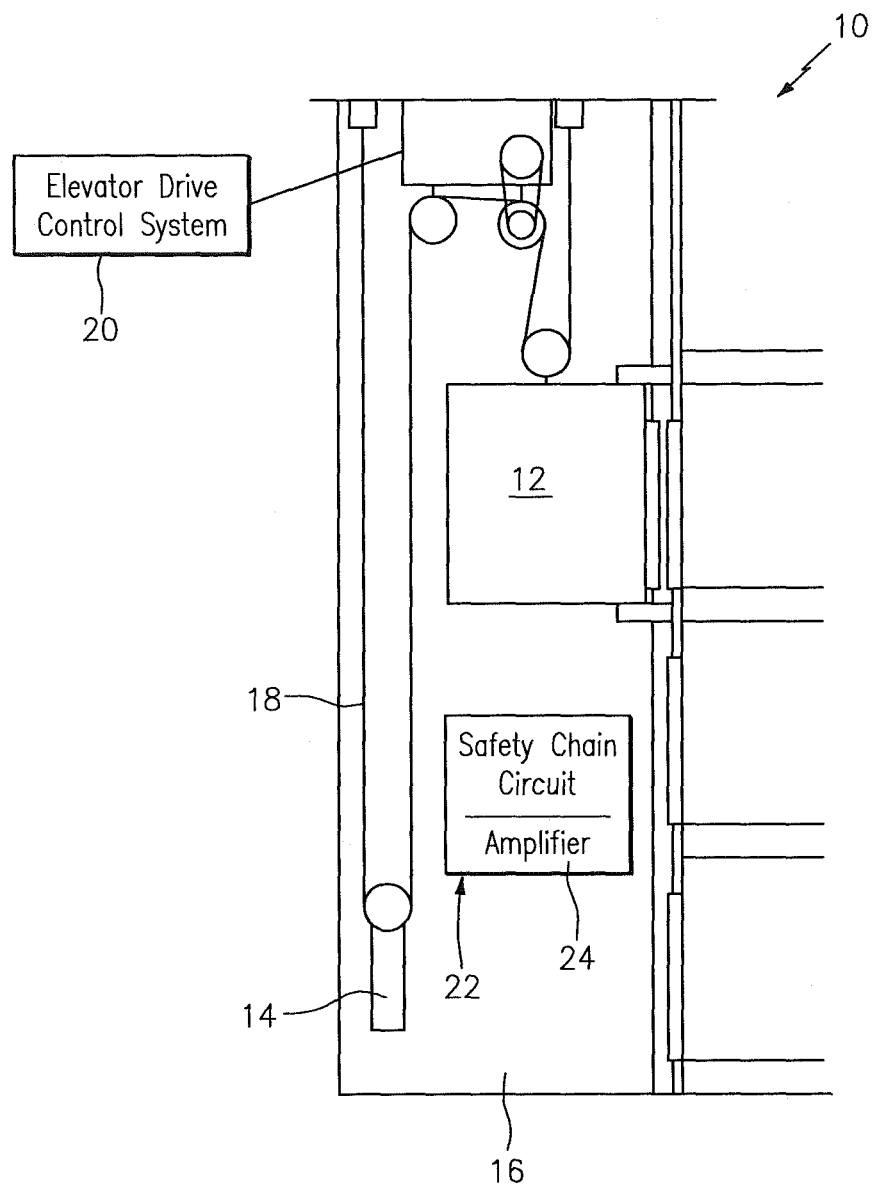
FIG. 1 is a diagrammatic view of an elevator system.

Referring to FIG. 1, a diagrammatic illustration of an elevator system 10 is shown including an elevator car 12 and a counterweight 14 disposed in a hoistway 16. A load bearing member 18 (e.g., a rope, a belt, etc.) extends between the car 12 and the counterweight 14, via an elevator drive located at the top of the hoistway 16. The elevator system 10 further includes an elevator drive control system 20 in electrical communication with elevator drive components (e.g., elevator drive, elevator machine brakes, etc.), the car 12, and the operator controls (not shown) located at each landing of the elevator system 10. The elevator system 10 further includes a safety chain circuit 22 that includes a plurality of protection devices (e.g., door lock contacts, emergency switches, overspeed devices, etc.) located throughout the hoistway 16, connected in series to one another, and in communication with elevator drive components via the elevator drive control system 20. Although the safety chain circuit 22 is depicted in a particular location in the hoistway 16, it is understood that the various components of the safety chain circuit may in practice be distributed throughout the hoistway 16. Similarly, the location of the amplifier 24, the elevator drive control system 20, and various other components of the elevator system 10 may be located in alternate configurations without deviating from the scope of the invention, as would be understood by a person skilled in the art. The "communication" between the safety chain circuit 22 and the elevator drive control system 20 can also assume a variety of different configurations. As described by way of example below, one or more optical couplers may be disposed within the safety chain circuit 22 to effectuate the communication between the safety chain circuit 22 and the elevator drive control system 20. The present invention is not, however, limited to using optical couplers.

The safety chain circuit 22 is configured within the elevator system 10 to be in either a "safe" mode or an "unsafe" mode. In the safe mode, all of the contacts of the protection devices connected in series within the circuit 22 are closed, thereby allowing electrical communication through the entire safety chain circuit 22. In the unsafe mode, the contacts of at least one of the protection devices within the safety chain circuit 22 are opened, thereby preventing electrical communication through the entire safety chain circuit 22. A monitoring device used within the safety chain circuit 22 is operable to determine the status of the circuit; i.e., whether the safety chain circuit 22 is in a "safe" or "unsafe" mode.

For safety reasons, regulatory codes often require the use of redundant switches (e.g., two or more) with certain electrically powered devices used within an elevator system 10 (e.g., elevator drive, elevator machine brake(s), etc.). The redundant switches (referred to hereinafter as "device switches") provide a back-up in the event one of the device switches malfunctions. The present invention provides an improved safety chain circuit 22 that can be utilized with the aforesaid redundant device switches, but is not limited to any particular application of redundant device switches within the elevator system 10.

Figure 2:
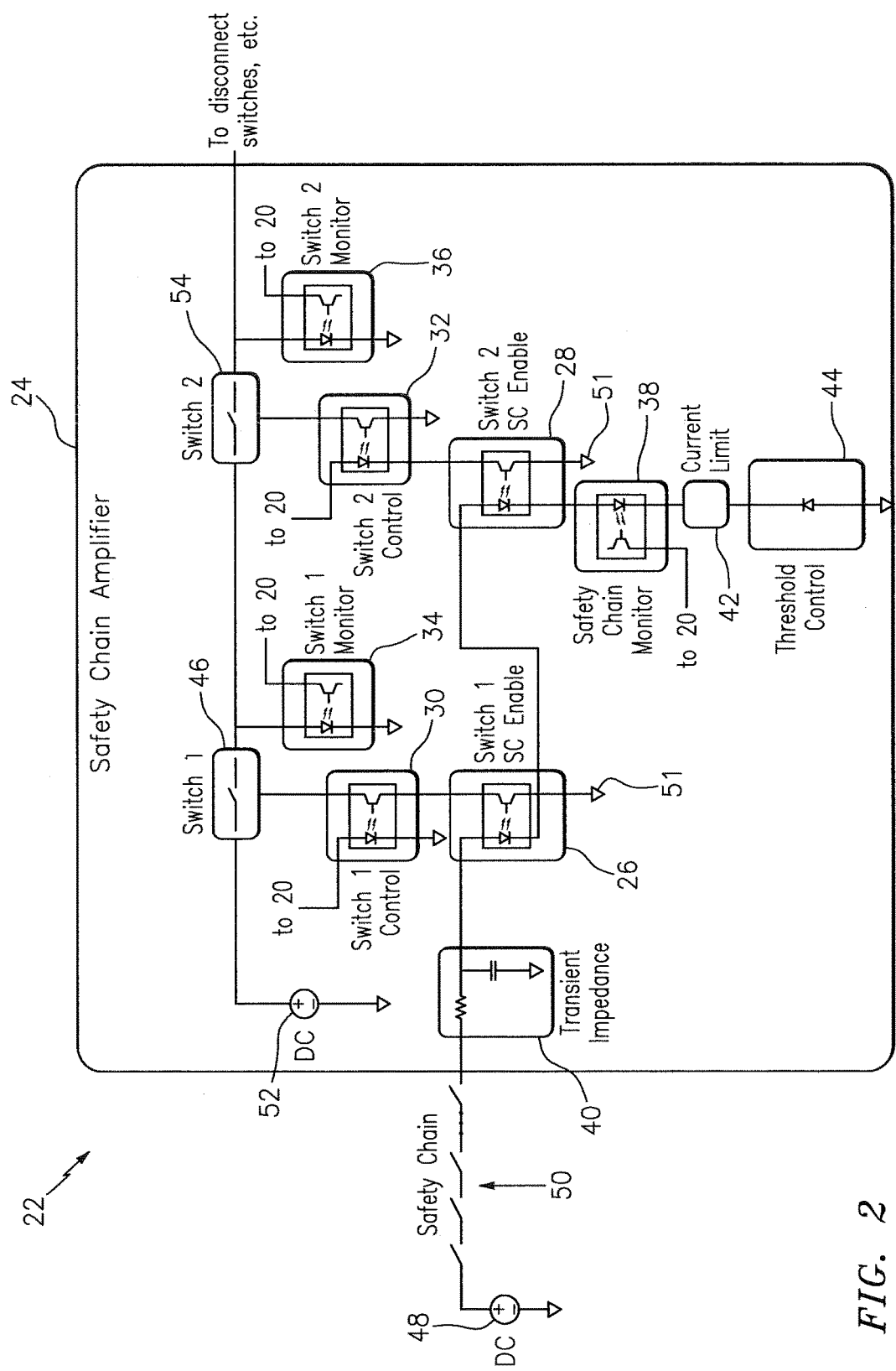
FIG. 2 is a diagrammatic view of a present invention safety chain amplifier embodiment.

Referring to FIG. 2, according to an aspect of the present invention the safety chain circuit 22 includes at least one safety chain amplifier 24. The safety chain amplifier 24 includes a first enabling switch 26, a second enabling switch 28, a (e.g., solid state) first control switch 30, a (e.g., solid state) second control switch 32, a first monitor switch 34, a second monitor switch 36, and a safety chain monitor 38. Although the safety chain amplifier 24 is shown in FIG. 2 as having a pair of enabling switches 26 and 28 and a pair of control switches 30 and 32, the present invention safety chain amplifier 24 is not so limited and may alternatively have more than two of each. In the embodiment diagrammatically shown in FIG. 2, the first and second enabling switches 26 and 28 are in series within the safety chain circuit 22. In some embodiments, the safety chain amplifier 24 also includes a device 40 operable to limit transient impedance within the safety chain circuit 22, a current limiting device 42, and a voltage threshold device 44. In the diagram of FIG. 2, the impedance limiting device 40, the current limiting device 42, and the voltage threshold device 44 are in series within the safety chain circuit 22.

The transient impedance limiting device 40 is operable as a "noise filter" for the electrical signals in the safety chain circuit 22. An example of an acceptable transient impedance limiting device is a low pass filter, although the present device is not limited to using low pass filters.

The voltage threshold device 44 is operable to prevent the passage of current until the voltage reaches a predetermined threshold, which threshold is chosen based on the application specific requirements of the safety chain amplifier 24. An example of an acceptable voltage threshold device is a zener diode, although the present device is not limited to using zener diodes.

The current limiting device 42 is operable to prevent a current draw above a predetermined value within the safety chain circuit 22. Various current limiting devices (e.g., current limiting circuits) are known to those skilled in the art and, thus, will not be discussed in further detail. A person of skill in the art will recognize therefore that the present invention is not limited to any particular current limiting device configurations.

FIG. 2 shows the enabling switches 26 and 28, control switches 30 and 32, monitor switches 34 and 36, and the safety chain monitor 38 diagrammatically as optical couplers (sometimes referred to as "opto-isolators", or "optoisolators" or "optocouplers"). The optical couplers represent a switching device that allows signals to be transferred between circuits while keeping the circuits electrically isolated from one another. For example, an input current applied to a photodiode (e.g., an LED) within a first portion of the optical coupler causes the diode to produce light that is subsequently sensed by a photosensor element (e.g., a photodiode, etc.). Upon receipt of the light signal, the photosensor element creates an electrical signal that is utilized elsewhere within the circuit as is described below in further detail. Optical couplers represent one type of switch that can be used as an enabling switch, a control switch, a monitor switch, and/or as a safety chain monitor. The present invention is not limited to using optical couplers, and may alternatively use one or more other types of switches such as, for example, magnetically and/or capacitively coupled isolation devices and/or solid state transistors (e.g., MOSFETs) either alone or in combination with other switches; e.g., combinations that utilize at least one optical coupler, or more than two types of switches.

Within the embodiment of the present safety chain amplifier 24 shown in FIG. 2, the first control switch 30 is in signal communication with (e.g., hardwired or wirelessly connected to) the first enabling switch 26, the elevator drive control system 20 and a first device switch 46. The first enabling switch 26 is operable to enable the first control switch 30, to control (e.g., activate and deactivate) the first device switch 46, in response to receiving electrical power from a first power source 48 through a safety chain 50; e.g., when the contacts of the protection devices within safety chain 50 are closed. The first enabling switch 26, for example, is operable to connect the first control switch 30 to an electrical ground 51 by closing its contacts. The elevator drive control system 20 is operable to provide a first control signal to the first control switch 30 in response to receiving operating commands (e.g., car calls). The first control switch 30, if enabled by the first enabling switch 26, is operable to control the first device switch 46 in response to receiving the first control signal. The first control switch 30, for example, is operable to activate the first device switch 46 by closing its contacts, which connects the first device switch 46 to the electrical ground 51 through the first enabling switch 26. The first device switch 46 is operable to direct power from a second power source 52 to the first monitor switch 34 and a second device switch 54 when activated by the first control switch 30. The first monitor switch 34 is operable to monitor status of the first device switch 46; e.g., whether the contacts of the first device switch 46 are closed or open. The first monitor switch 34 is also operable to provide a feedback signal to the elevator drive control system 20 indicative of the status of the first device switch 46.

The second control switch 32 is in signal communication with the elevator drive control system 20, the second enabling switch 28 and the second device switch 54. The elevator drive control system 20 is operable to provide a second control signal to the second control switch 32 in response to receiving the operating commands. The second enabling switch 28 is operable to enable the second control switch 32, to control the second device switch 54, in response to receiving electrical power from the first power source 48 through the safety chain 50 and the first enabling switch 26. The second enabling switch 28, for example, is operable to connect the second control switch 32 to the electrical ground 51 by closing its contacts, which permits the second control switch 32 to receive the second control signal. The second control switch 32 is operable, if enabled by the second enabling switch 28, to control the second device switch 54 in response to receiving the second control signal. The second control switch 32, for example, is operable to activate the second device switch 54 by closing its contacts, which connects the second device switch 54 (e.g., directly) to the electrical ground 51. The second device switch 54 is operable to direct power from the first device switch 46 to the second monitor switch 36 and the disconnect switches in response to receiving the second command signal from the second control switch 32. The second monitor switch 36 is operable to monitor status of the second device switch 54; e.g., whether the contacts of the second device switch 54 are closed or open. The second monitor switch 36 is also operable to provide a feedback signal to the elevator drive control system 20 indicative of the status of the second device switch 54.

The safety chain circuit 22 can be operated in a safe mode and an unsafe mode. During the safe mode, for example, the contacts of the first device switch 46 and the second device switch 54 are closed; e.g., the switches 46 and 54 are active. The disconnect switches receive electrical power from the second power source 52 through the device switches 46 and 54, which enables the elevator drive components to operate in a normal fashion. The elevator drive components, for example, can perform commands provided by the elevator drive control system 20; e.g., move the elevator car 12 between floors. During the unsafe mode, the contacts of the first device switch 46 and/or the second device switch 54 are open; e.g., the switches 46 and 54 are inactive. The disconnect switches do not receive power from the second power source 52, which prevents the elevator drive components from operating in a normal fashion. The elevator drive components, for example, cannot perform the commands provided by the elevator drive control system 20.

The safety chain monitor 38 is operable to monitor status of the safety chain circuit 22; e.g., whether the safety chain circuit 22 is operating in the safe mode or the unsafe mode. The safety chain monitor 38 is also operable to provide a feedback signal to the elevator drive control system 20 indicative of the safety chain circuit 22. The feedback signal may indicate that the safety chain circuit 22 is in the safe mode, for example, when the monitor 38 receives power from the first power source 48 through the safety chain 50, the first enabling switch 26 and the second enabling switch 28. The feedback signal may indicate that the safety chain circuit 22 is in the unsafe mode, for example, when the monitor 38 does not receive power from the first power source 48; e.g., when one or more of the contacts of the protection devices within safety chain 50 are open.

In the embodiment of the present safety chain amplifier 24 shown in FIG. 2, the elevator drive control system 20 is operable to process the feedback signals provided by the first monitor switch 34, the second monitor switch 36 and the safety chain monitor 38 to determine whether there is a fault in the safety chain amplifier 24. The elevator drive control system 20 may determine there is a fault, for example, when (i) the elevator drive control system 20 provides the first and/or second control signals to the control switches 30 and 32, (ii) the safety chain monitor 38 provides a feedback signal indicating the safety chain circuit 22 is in the safe mode, but (iii) the first monitor switch 34 and/or the second monitor switch 36 provide feedback signals indicating the contacts in the first device switch 46 and/or the second device switch 54 are open. Such a fault can be caused by, for example, one or more of the switches 26, 28, 30, 32, 46 and 54 malfunctioning. By determining whether there is a fault in the safety chain amplifier 24, the elevator drive control system 20 can take appropriate actions to prevent operating the elevator system 10 in an unsafe condition, schedule maintenance, etc. For example, if the contacts of the first device switch 46 and the second device switch 54 are stuck in a closed position, the elevator drive control system 20 can stop providing commands to the elevator drive components to deactivate the elevator system 10.

Prior art safety chain circuit configurations that are in direct communication with elevator drive components (e.g., configurations wherein protective relay coils and/or other disconnect means in the drive are wired in series with the safety chain) can be subject to substantially large power draw variability. As a result, the components within the prior art safety chains must be scaled to accommodate the relatively large power draw variability. According to various embodiments of the present invention, in contrast, the electrical signals passed through the safety chain 50 and the amplifier 24 are separated from (i.e., are independent of) the electrical signals used to power elevator drive components (e.g., protective relay coils, etc.) within the elevator system 10. The present invention consequently can eliminate a substantial source of power variability and permit the safety chain circuit 22 to utilize a power draw that is relatively consistent and fixed. The present amplifier 24 and the current draw of the safety chain can therefore be scaled based on the safety chain circuit application at hand rather than being based on the power draw variability resulting from elevator drive system components. In addition, because the present amplifier 24 monitors the status of the safety chain and does not draw current from it to operate the device switches 46 and 54, the viable hoistway length for a low voltage safety chain according to various embodiments of the present invention can be significantly increased; e.g., the voltage drop within the safety chain circuit 22 at extended distances is significantly reduced relative to prior art configurations. Hence, under the present invention low voltage safety chain circuits 22 can be utilized in longer hoistways previously not possible given the limitations of prior art safety chain systems.

Figure 3:
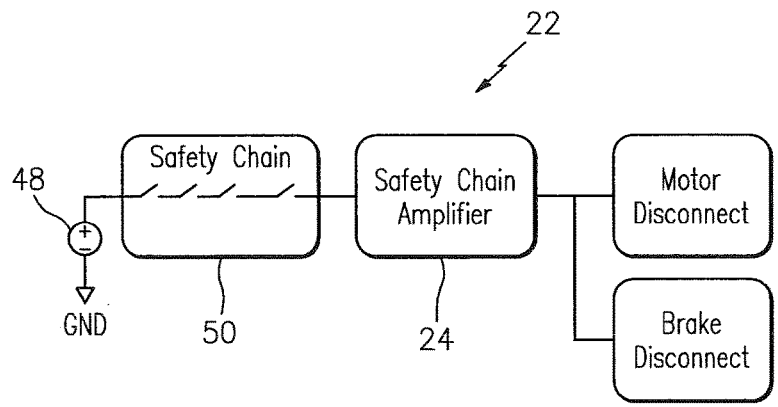
FIG. 3 is a block diagram illustrating a single present invention safety chain amplifier in series within a safety chain circuit of an elevator system.
Figure 4:
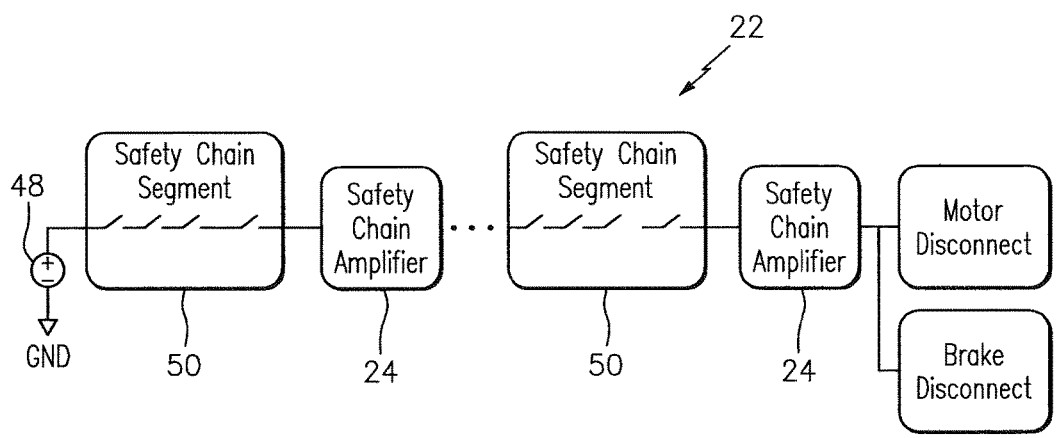
FIG. 4 is a block diagram illustrating a plurality of present invention safety chain amplifiers in series within a safety chain circuit of an elevator system.

The block diagram depicted in FIG. 3 illustrates a safety chain circuit 22 utilizing a single present invention safety chain amplifier 24. The diagram illustrates a safety chain 50 having "n" number of protection devices, where "n" is an integer greater than one, to notate that the present invention is not limited to use with a safety chain having any particular number of protection devices. The block diagram depicted in FIG. 4 illustrates a safety chain circuit 22 utilizing "x" number of safety chain amplifiers 24 serially connected to "y" number of safety chains 50, where "x" and "y" are each integers greater than one, to notate that the present invention is not limited to use any particular number of safety chain amplifiers 24 and/or safety chains 50.

Figure 5:
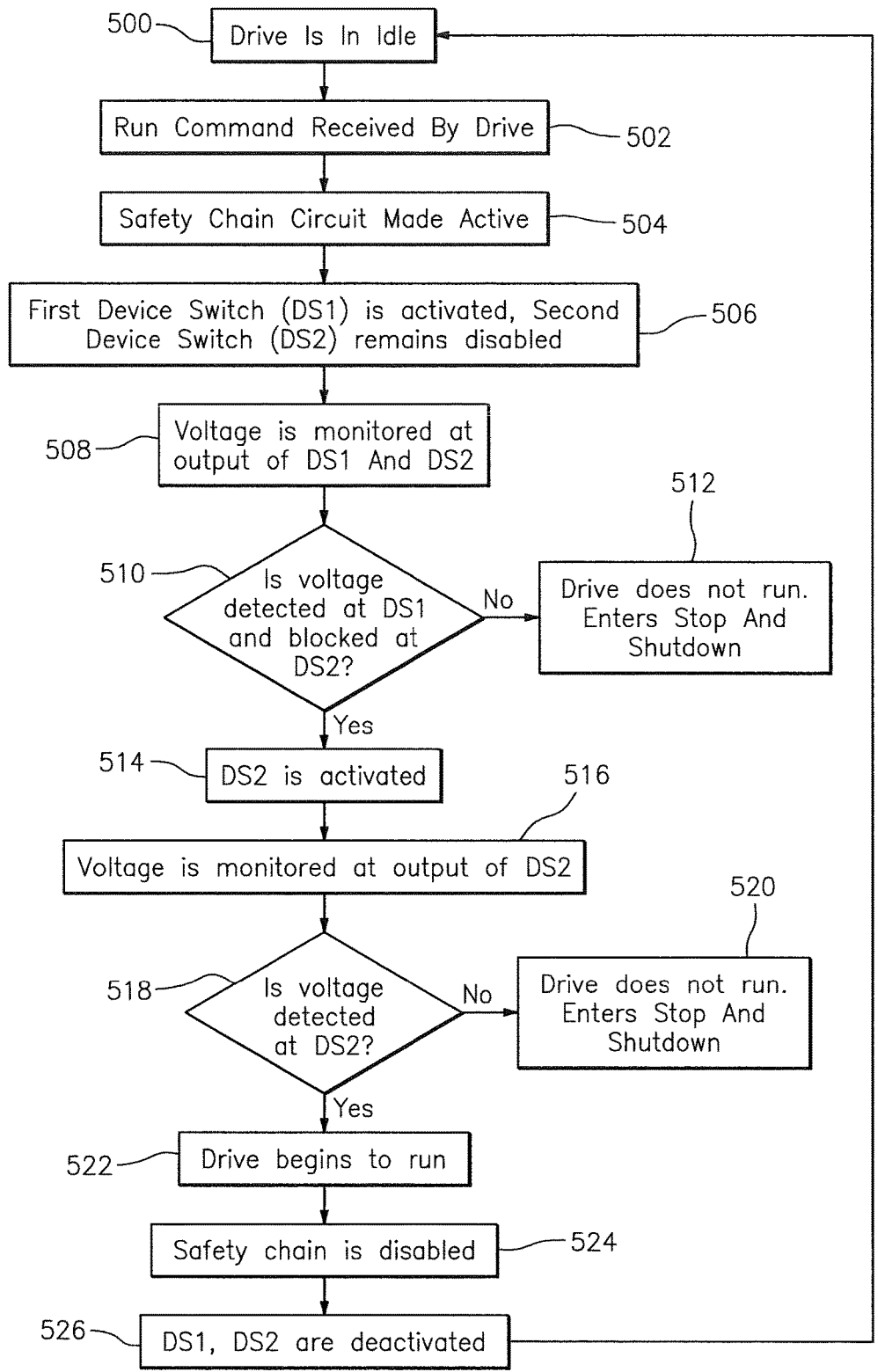
FIG. 5 is a block diagram illustrating an example of the functionality of the present invention safety chain circuit.

The block diagram depicted in FIG. 5 is directed toward a redundant device switch system in an elevator system 10, which elevator system 10 is described hereinafter as including the present invention safety chain circuit 22. The specific steps and order of steps described below are an example of a functionality that could be implemented using the present invention safety chain circuit 22. The present invention is not limited to this example, however.

In block 500, the elevator drive is in an idle state; e.g., the elevator car 12 is stationary and no control command is pending. In block 502, a run command (e.g., a call to a particular floor) is received by the elevator drive control system 20. At this point (block 504), power is applied to the safety chain circuit 22 and the powered circuit is referred to as being "active". The first enabling switch 26 and the second enabling switch 28 therefore respectively enable the first control switch 30 and the second control switch 32.

In block 506, the enabled first control switch 30 activates the first device switch 46 in response to receiving the first control signal from the elevator drive control system 20. The second device switch 54 is maintained open and inactive at this point.

In blocks 508 and 510, the feedback signals from the first and second monitor switches 34 and 36 are monitored and evaluated by the elevator drive control system 20. For example, if voltage is present across both the first monitor switch 34 and the second monitor switch 36, the elevator drive control system 20 determines there is a fault in the safety chain circuit 22 (e.g., there should be zero voltage across the second monitor switch 36) and prevents operation of the elevator system 10 (block 512). If voltage is present at the first monitor switch 34 but not the second monitor switch 36, then the elevator drive control system 20 determines the safety chain circuit 22 is functioning correctly, and allows further operation of the elevator (block 514). The further operation includes activating the second device switch 54 using the enabled second control switch 32 when the switch 32 receives the second control signal from the elevator drive control system 20.

In blocks 516 and 518, the feedback signal from the second monitor switch 36 is monitored and evaluated by the elevator drive control system 20. For example, if no voltage is present across the second monitor switch 36 with the second device switch 54 activated (e.g., closed), the elevator drive control system 20 determines there is a fault in the safety chain circuit 22 (e.g., there should be a voltage across the second monitor switch 36) and prevents operation of the elevator system 10 (block 520). If voltage is present at the second monitor switch 36, then the elevator drive control system 20 determines the safety chain circuit 22 is functioning correctly, and allows further operation of the elevator system 10; i.e., operation of the elevator drive according to the operating command (block 522).

One or more of the devices in the safety chain 50 may fail during elevator system 10 operation causing the safety chain circuit 22 to become disabled (block 524); e.g., the power provided to the disconnect switches is terminated by the opening of the enabling switches 26 and/or 28. When the elevator car 12 is stopped at the appropriate location, the device switches 46 and 54 are deactivated (block 526) and the elevator drive reverts to an idle state (block 500). The aforedescribed process may subsequently be repeated when the next operating command is placed.

A person of skill in the art will recognize that the aforedescribed safety chain circuit 22 can be included in various systems other than the elevator system 10 described above. For example, the disconnect switches actuated by the safety chain circuit 22 may be connected to effectors (e.g., motors, brakes, etc.) of, for example, an escalator system, an industrial automation system (e.g., a semi-automated or fully-automated manufacturing line and/or assembly line), etc.

While various embodiments of the present invention have been disclosed, it will be apparent to those of ordinary skill in the art that many more embodiments and implementations are possible within the scope of the invention. For example, the present invention as described herein includes several aspects and embodiments that include particular features. Although these features may be described individually, it is within the scope of the present invention that some or all of these features may be combined within any one of the aspects and remain within the scope of the invention. To give a specific example, some embodiments of the present invention safety chain circuit 22 include a single safety chain amplifier 24. Other embodiments may include more than one safety chain amplifier 24 in the safety chain circuit and remain within the scope of the invention. In addition, the term "contacts" as used herein is not limited here to physical contacts, but includes other switching devices operable to perform the same function such as, for example, optical couples, solid state transistors (e.g., MOSFETs), magnetically and/or capacitively coupled isolation devices, etc. Accordingly, the present invention is not to be restricted except in light of the attached claims and their equivalents.

What is claimed is:

1. A safety chain circuit for use with a control system that provides a first control signal and a second control signal, the safety chain circuit comprising:
   a plurality of protection devices serially connected between a first chain end and a second chain end; and
   an amplifier including a first device switch and a second device switch serially connected between a power input and a power output, a first enabling switch connected between the second chain end and a second enabling switch, and a first control switch and a second control switch;
   wherein the first enabling switch is operable to enable the first control switch to control the first device switch, and the second enabling switch is operable to enable the second control switch to control the second device switch; and
   wherein the enabled first control switch is operable to control the first device switch in response to receiving the first control signal, and the enabled second control switch is operable to control the second device switch in response to receiving the second control signal.

2. The safety chain circuit of claim 1, wherein the first control switch is connected between the first enabling switch and the first device switch, and the second control switch is connected between the second enabling switch and the second device switch.

3. The safety chain circuit of claim 1, wherein the first chain end is connected to a first power source, and the power input is connected to a second power source that is different than the first power source.

4. The safety chain circuit of claim 1, wherein the second chain end is electrically isolated from the power output.

5. The safety chain circuit of claim 1, wherein the first enabling switch and the second enabling switch are operable to respectively enable the first control switch and the second control switch in a safe mode, and respectively disable the first control switch and the second control switch in an unsafe mode.

6. The safety chain circuit of claim 1, wherein
   the amplifier further includes a safety chain monitor operable to monitor status of the plurality of protection devices; and
   the second enabling switch is connected between the first enabling switch and the safety chain monitor.

7. The safety chain circuit of claim 1, wherein
   the amplifier further includes a first monitor switch connected to the first device switch; and
   the first monitor switch is operable to monitor status of the first device switch.

8. The safety chain circuit of claim 1, wherein
   the amplifier further includes a second monitor switch connected to the second device switch; and
   the second monitor switch is operable to monitor status of the second device switch.

9. The safety chain circuit of claim 1, wherein
   the amplifier further includes a safety chain monitor operable to monitor status of the plurality of protection devices, a first monitor switch operable to monitor status of the first device switch, and a second monitor switch operable to monitor status of the second device switch;
   the safety chain monitor, the first monitor switch and the second monitor switch are further operable to provide respective feedback signals to the control system indicative of the status of the plurality of protection devices, the first device switch and the second device switch; and the second enabling switch is connected between the first enabling switch and the safety chain monitor, the first monitor switch is connected to the first device switch, and the second monitor switch is connected to the second device switch.

10. The safety chain circuit of claim 1, wherein the first enabling switch is operable to connect the first device switch to an electrical ground through the first control switch.

11. The safety chain circuit of claim 10, wherein the second enabling switch is operable to connect the second control switch to the electrical ground such that the second control switch is operable to receive the second control signal.

12. The safety chain circuit of claim 1, wherein the plurality of protection devices comprise a plurality of elevator protection devices.

13. The safety chain circuit of claim 12, wherein one of the plurality of elevator protection devices comprises one of an elevator door lock contact, an elevator emergency switch and an elevator overspeed device.

14. The safety chain circuit of claim 1, wherein the plurality of protection devices comprise one of a plurality of escalator protection devices and a plurality of industrial automation system protection devices.

15. The safety chain circuit of claim 1, wherein the first control switch comprises a solid state first control switch, and the second control switch comprises a solid state second control switch.

16. An elevator system, comprising:
one or more elevator drive components respectively connected to one or more disconnect switches;
an elevator drive control system operable to control one or more elevator drive components, and provide a first control signal and a second control signal;
a plurality of elevator protection devices serially connected between a first power source and a chain end; and
an amplifier including a first device switch and a second device switch serially connected between a second power source and the one or more disconnect switches, a first enabling switch connected between the chain end and a second enabling switch, and a solid state first control switch and a solid state second control switch;
wherein the first enabling switch is operable to enable the first control switch to control the first device switch, and the second enabling switch is operable to enable the second control switch to control the second device switch; and
wherein the enabled first control switch is operable to control the first device switch in response to receiving the first control signal, and the enabled second control switch is operable to control the second device switch in response to receiving the second control signal.

17. The elevator system of claim 16, wherein
the first enabling switch and the second enabling switch are operable to respectively enable the first control switch and the second control switch in a safe mode, and respectively disable the first control switch and the second control switch in an unsafe mode; and
the second power source is operable to provide electrical power to the one or more disconnect switches through the first device switch and the second device switch in the safe mode, but not in the unsafe mode.

18. The elevator system of claim 16, wherein
the first enabling switch is operable to connect the first device switch to an electrical ground through the first control switch; and
the second enabling switch is operable to connect the second control switch to the electrical ground such that the second control switch is operable to receive the second control signal.

19. The elevator system of claim 16, wherein the one or more elevator drive components comprises at least one of an elevator drive and an elevator machine brake.

20. An escalator system, comprising:
one or more escalator drive components respectively connected to one or more disconnect switches;
an escalator drive control system operable to control one or more escalator drive components, and provide a first control signal and a second control signal;
a plurality of escalator protection devices serially connected between a first power source and a chain end; and
an amplifier including a first device switch and a second device switch serially connected between a second power source and the one or more disconnect switches, a first enabling switch connected between the chain end and a second enabling switch, and a solid state first control switch and a solid state second control switch;
wherein the first enabling switch is operable to enable the first control switch to control the first device switch, and the second enabling switch is operable to enable the second control switch to control the second device switch; and
wherein the enabled first control switch is operable to control the first device switch in response to receiving the first control signal, and the enabled second control switch is operable to control the second device switch in response to receiving the second control signal.

* * * * *